United States Patent [19]
Zink

[11] Patent Number: 6,085,280
[45] Date of Patent: Jul. 4, 2000

[54] PARALLEL-ACCESS MEMORY AND METHOD

[75] Inventor: Sébastien Zink, Le prokofie, France

[73] Assignee: SGS-Thomson Microelectronics S.A., Saint Genis, France

[21] Appl. No.: 08/853,526

[22] Filed: May 9, 1997

[30] Foreign Application Priority Data

May 10, 1996 [FR] France .................................. 96 06123

[51] Int. Cl.[7] .................................................. G06F 12/00
[52] U.S. Cl. ............................... 711/5; 711/127; 711/211; 711/217; 711/219
[58] Field of Search .............................. 211/5, 211, 217, 211/219, 127; 365/230.03, 230.04, 230.02, 189.02, 189.04; 395/559

[56] References Cited

U.S. PATENT DOCUMENTS

| | | | |
|---|---|---|---|
| 4,866,603 | 9/1989 | Chiba ........................................ | 364/200 |
| 4,987,559 | 1/1991 | Miyauchi et al. ..................... | 365/189.04 |
| 5,016,226 | 5/1991 | Hiwada et al. ........................ | 365/233 |
| 5,093,805 | 3/1992 | Singh ...................................... | 365/51 |
| 5,285,421 | 2/1994 | Young et al. .......................... | 365/230.04 |
| 5,295,252 | 3/1994 | Torii et al. ............................. | 711/127 |
| 5,544,351 | 8/1996 | Lee et al. ............................... | 395/559 |
| 5,610,864 | 3/1997 | Manning ................................ | 365/193 |
| 5,663,922 | 9/1997 | Tailliet ................................... | 365/240 |
| 5,754,815 | 5/1998 | Ernst et al. ............................ | 711/5 |
| 5,761,714 | 6/1998 | Liu et al. ............................... | 711/127 |
| 5,761,732 | 6/1998 | Shaberman et al. .................. | 711/157 |

FOREIGN PATENT DOCUMENTS

| | | | |
|---|---|---|---|
| 0 712 133 | 5/1996 | European Pat. Off. .......... | G11C 8/00 |
| 2 117 945 | 10/1983 | United Kingdom .............. | G11C 7/00 |

OTHER PUBLICATIONS

French Search Report from French application No. 96 06123, filed May 10, 1996.
Patent Abstracts of Japan, vol. 8, No. 214, Sep. 29, 1984 & JP-A-59 098363, Hiroaki.
Patent Abstracts of Japan, vol. 5, No. 42, Mar. 20, 1981 & JP-A-55 163677, Katsuro.
Patent Abstracts of Japan, vol. 5, No. 26, Feb. 17, 1981 & JP-A-55 150178, Masayuki.
Patent Abstracts of Japan, vo. 11, No. 328, Oct. 27, 1987 & JP-A-62 112292, Keiichi.

*Primary Examiner*—John W. Cabeca
*Assistant Examiner*—Nasser Moazzami
*Attorney, Agent, or Firm*—Wolf, Greenfield & Sacks, P.C.

[57] ABSTRACT

A parallel type of memory is divided into P sub-arrays with which there are associated column and row decoding circuits and read circuits. Circuits are used to produce and give P addresses simultaneously to the decoding circuits on the basis of a given address so as to enable the simultaneous reading of P words from a single address. Circuits receive the P information elements extracted from the P words and give them in series at an output port at a frequency greater than the reading frequency. Thus the access time to the information elements seen from the exterior of the memory is reduced.

36 Claims, 5 Drawing Sheets

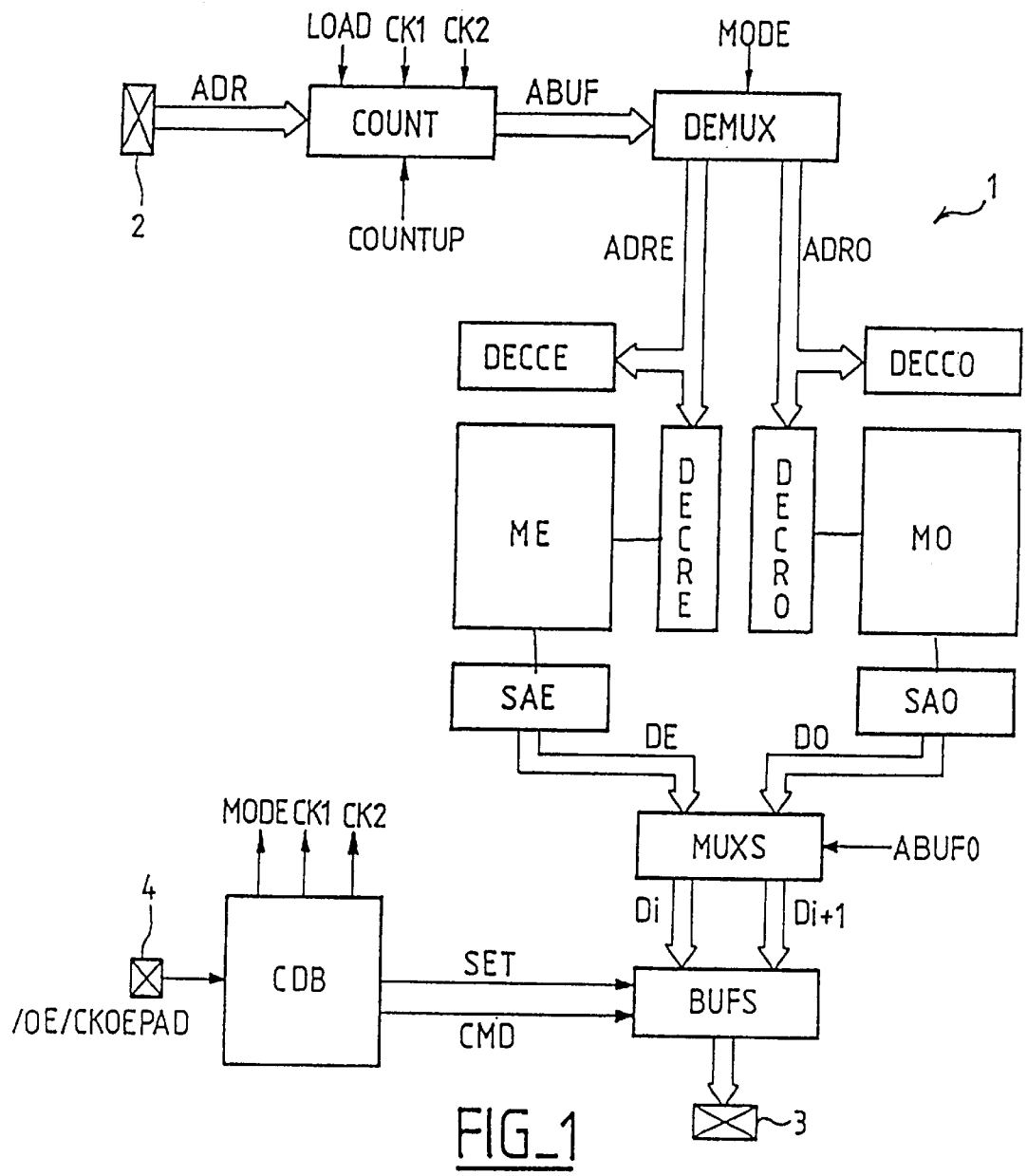
FIG_1
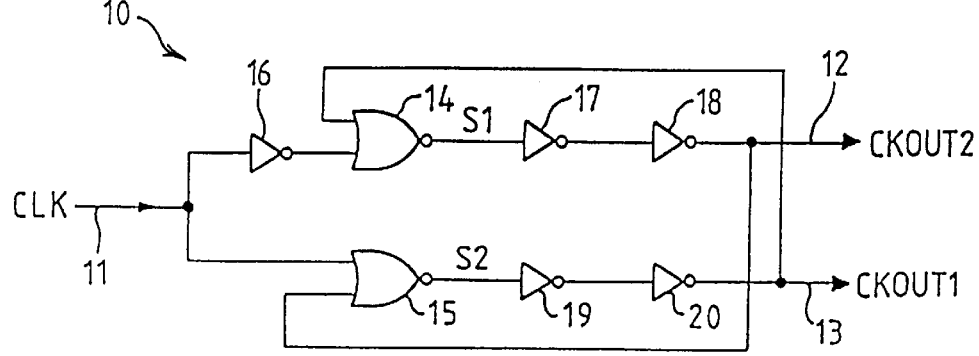
FIG_2

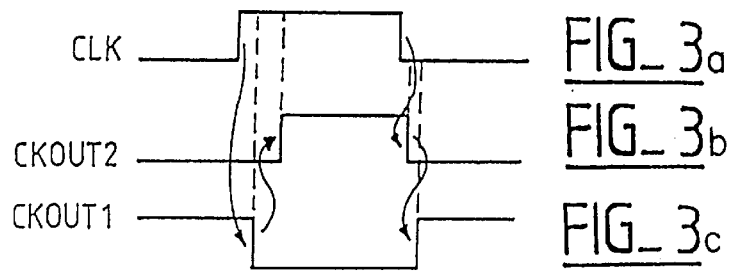
FIG_3a
FIG_3b
FIG_3c
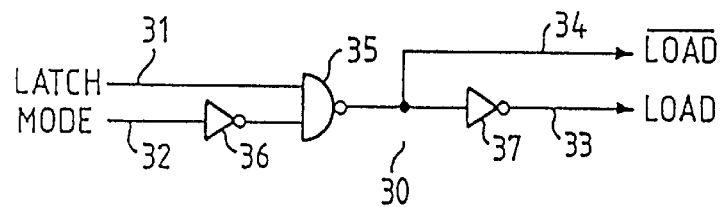
FIG_4
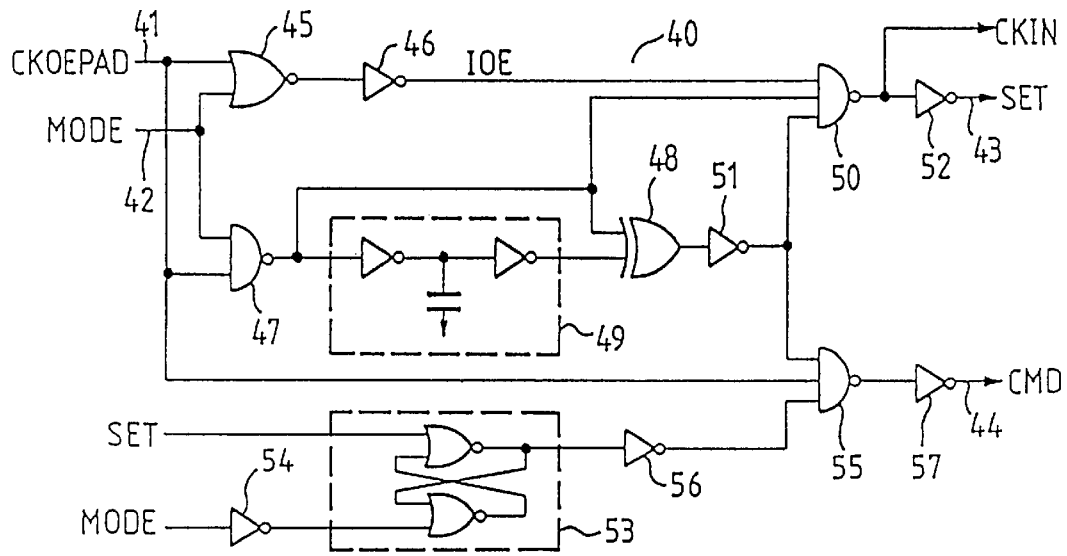
FIG_5

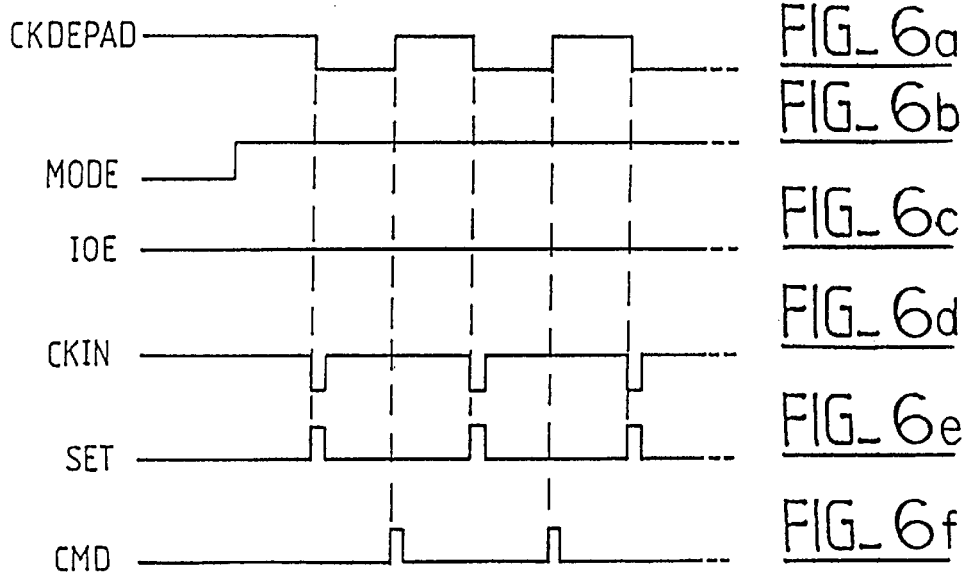
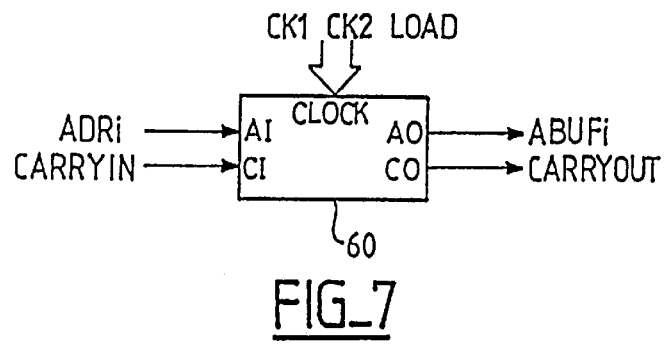
FIG_7
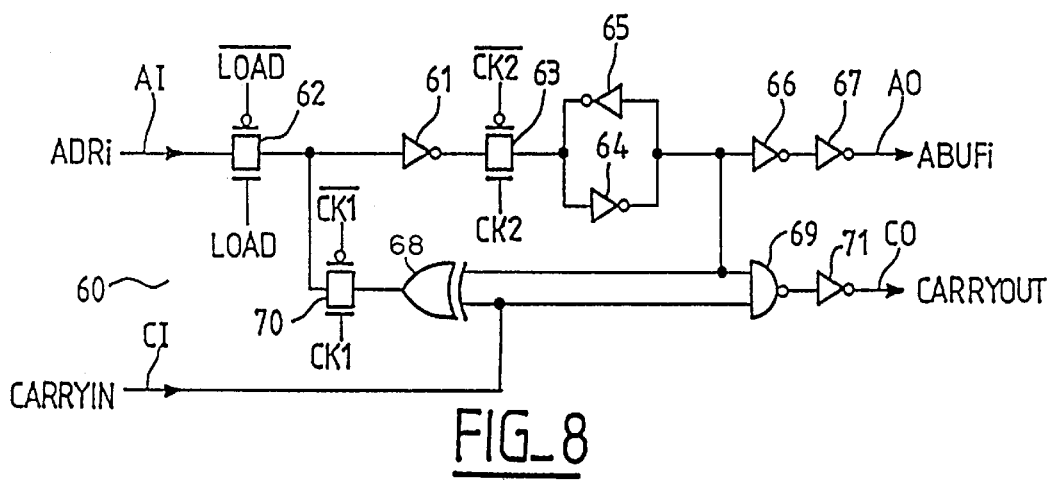
FIG_8

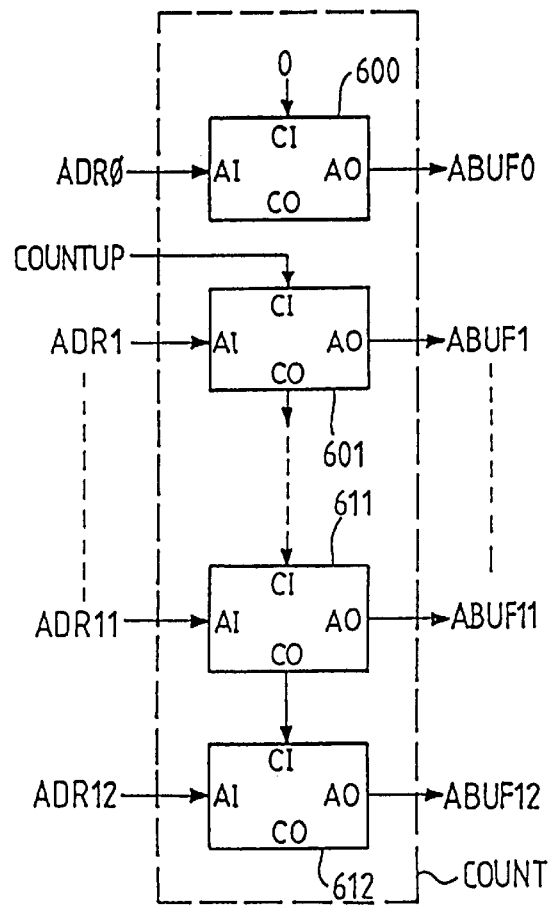
FIG_9
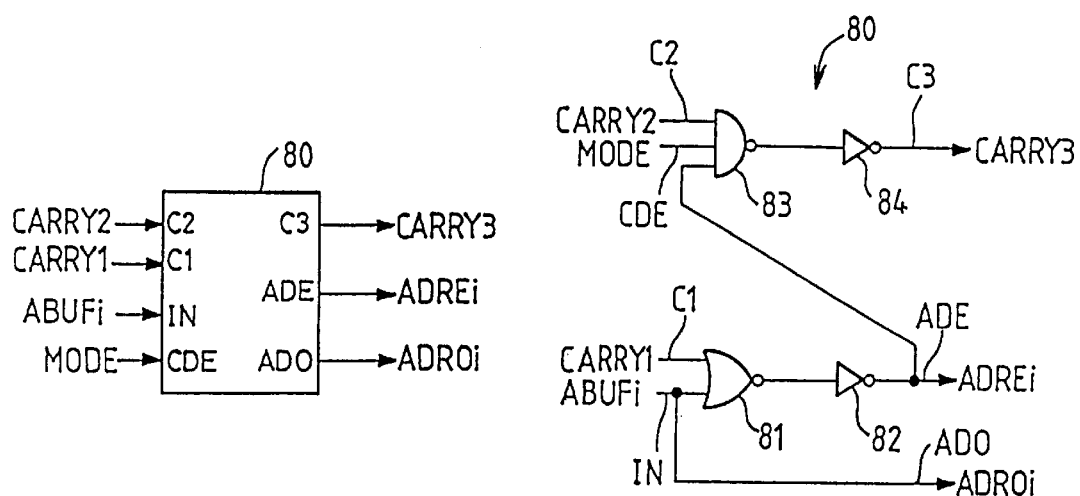
FIG_10        FIG_11

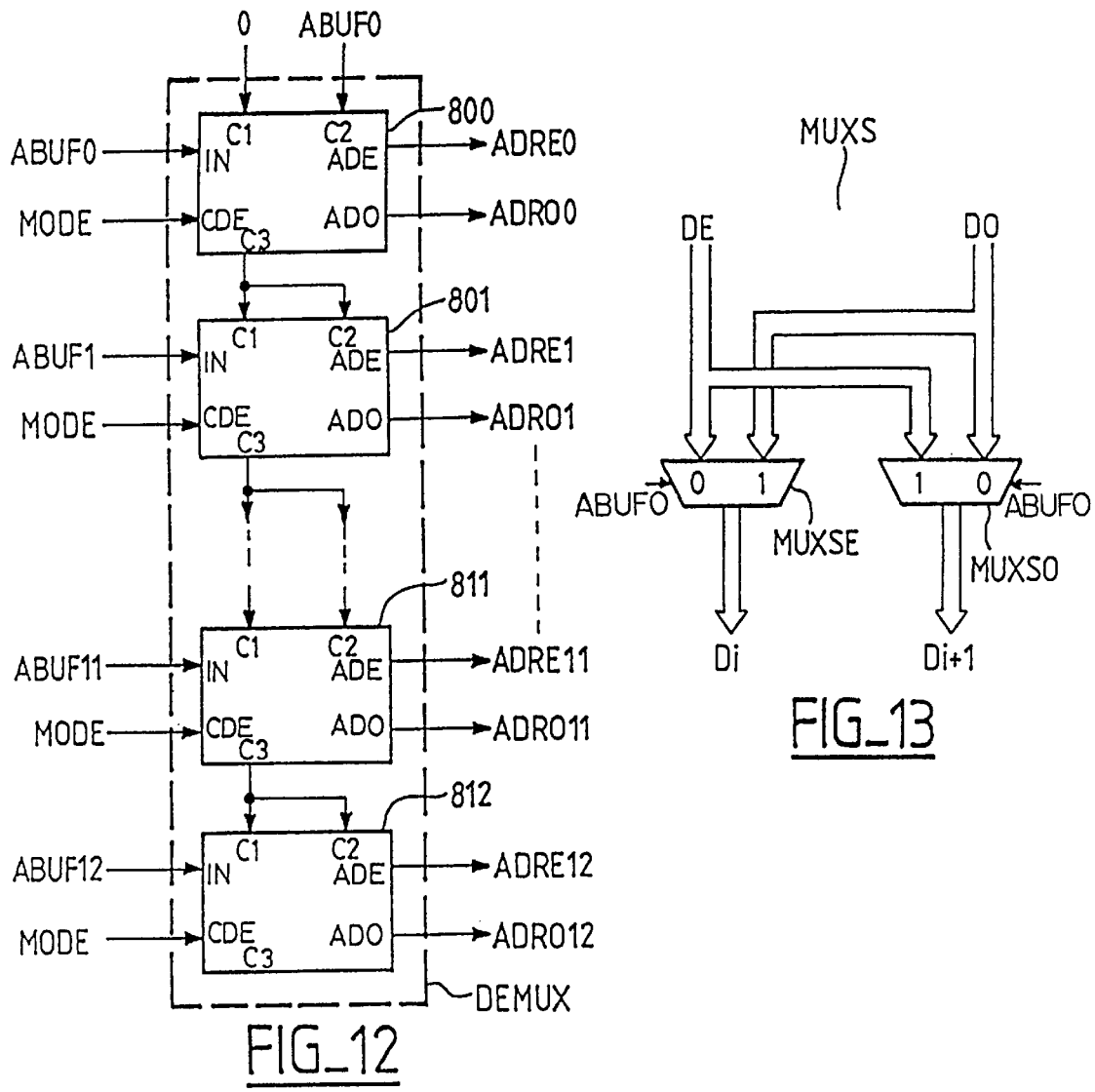
FIG_12
FIG_13
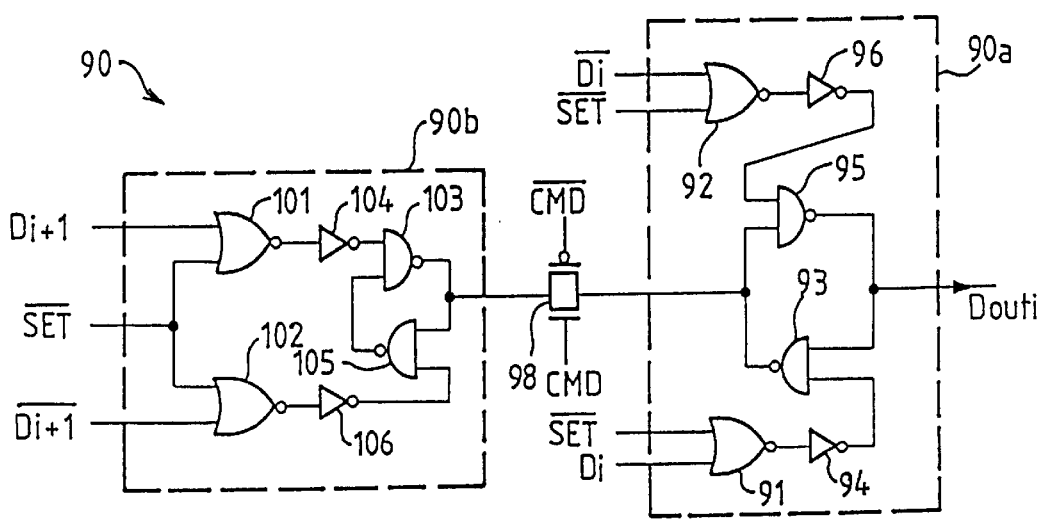
FIG_14

PARALLEL-ACCESS MEMORY AND METHOD

BACKGROUND OF THE INVENTION

1. Field of the Invention

The invention relates to parallel-access memories. It relates more particularly to electrically erasable and programmable non-volatile memories (better known as EEPROMs) although it can be applied to other types of volatile or non-volatile memories.

2. Discussion of the Related Art

Current development of integrated circuit memories with very high information storage capacities (in the sense of the number of information elements stored) has been accompanied by a desire to increase the clock signal frequencies driving the operation of the system in which these memories are used. Thus, there is also a desire for increasingly shorter times of access to the contents of the words contained in these memories. The term "word" in this specification refers to a physical entity whose contents represent a binary information element encoded on B bits, B being an integer. Typically, these words will be formed by B elementary storage cells, each elementary cell of which includes a storage circuit.

From the viewpoint of access time, parallel-access memories have many advantages. In these memories, the addresses of the words to be read and/or written are given on a parallel address bus and the words read and/or written are given and/or received on a parallel data bus. However, the space requirement and the package weight of these memories is often greater than in the case of serial-access memories, because they often use a larger number of connection pins and are therefore costlier.

It is increasingly being sought to raise the operating frequencies of computer systems and hence o of the memories implemented in these systems. In practice, increasing the operating frequencies of memories raises technical problems related to the time of read mode access to the contents of the memories. The term "time of read mode access" is understood to mean the period of time between the time when the address of a word is known to a memory and the time when the binary information element represented by the contents of the cells of the word is available outside the memory.

In practice, the access time is typically limited by the time needed for the sequencing of the following two steps:

(1) the decoding of the address received by the memory, namely the position of various switching devices that connect one or more read circuits to the word whose contents represent the binary information element to be read; and (2) the reading process proper, namely the extraction of the binary information element, in the form of logic signals, on the basis of the word read (the cells of the word no longer necessarily store a directly usable logic information element but more generally have a variable physical characteristic that an appropriate circuit will convert into a logic signal).

The reduction of the access time entails an increase in the switching speeds during the decoding and/or a reduction of the reaction times of the read circuits. It is often the case that a solution causes high power consumption. This is not desirable for memories that are designed for battery-powered portable applications wherein a minimum power consumption is sought. In practice, it is therefore the maximum admissible access time envisaged that determines the operating frequencies of the systems in which the memories are used.

SUMMARY OF THE INVENTION

An aim of the invention is a method of reading and an organization of parallel-access memories that is simple, with limited power consumption, and has an operation with respect to the exterior that is similar to the standard reading method and organization of a known type of parallel-access memory.

An embodiment of the invention simultaneously reads several words located at addresses produced by the memory on the basis of decoding an initial address given to the memory. The binary information elements represented by the different words read simultaneously are stored and given in series to the exterior of the memory in a selective manner. It is thus possible to reduce the access time as perceived from the exterior of the memory. Indeed, the series connection and series output of information extracted in parallel relates to logic data and can therefore be carried out in practice at a higher frequency than the reading operation proper.

Thus, an aspect of the invention relates to a method for reading the contents of words of a parallel type memory, this memory being organized in matrix form in words, the contents of each word representing a binary information element, each word being accessible at a particular address encoded in binary form on K bits, K being an integer greater than one, the address bits being received in parallel by the memory on an address input parallel port.

A method in accordance with an embodiment of the invention comprises steps of receiving an initial address on an address input port, automatically producing a set of distinct addresses from the initial address, simultaneously reading the group of words corresponding to the distinct addresses, and serially supplying the extracted binary information elements to a data output parallel port.

An embodiment of the invention also relates to a parallel memory organized in words, the contents of each word representing a binary information element, each word being accessible at a particular address encoded in binary form on K bits, K being an integer greater than one, the memory comprising an address input parallel port to receive the address bits in parallel, a data output parallel port to give the binary information elements corresponding to the contents of the words addressed, circuits for the decoding of the address bits received, circuits for the reading of the words. The memory comprises P memory sub-arrays with which there are associated column and row decoding circuits and read circuits, circuits capable of producing and giving, in a mode called a group reading mode, P addresses simultaneously to the decoding circuits on the basis of an address given so as to enable the simultaneous reading of P words of a group and circuits receiving the P information elements extracted from the P words and giving them in series to the output port at a frequency greater than the reading frequency.

BRIEF DESCRIPTION OF THE DRAWINGS

Other advantages and particular features shall appear from the following description of an exemplary embodiment, given with reference to the appended drawings, of which:

FIG. 1 gives a schematic view of a memory according to an embodiment of the invention;

FIG. 2 shows a circuit for the production of non-overlapping clock signals;

FIG. 3 is a timing diagram of signals associated with the circuit of FIG. 2;

FIG. 4 shows a circuit for the production of control signals used in the memory according to an embodiment of the invention.

FIG. 5 shows another circuit for the production of control signals used in the memory according to an embodiment of the invention;

FIG. 6 is a timing diagram of control signals associated with the circuit of FIG. 5;

FIG. 7 gives a schematic view of an elementary cell of a counting circuit;

FIG. 8 shows a possible internal structure of the cell of FIG. 7;

FIG. 9 shows a counting circuit made out of cells such as the one shown in FIGS. 7 and 8;

FIG. 10 gives a schematic view of an elementary cell of an address production circuit;

FIG. 11 shows a possible internal structure of the cell of FIG. 10;

FIG. 12 shows an address production circuit made out of cells such as the one shown in FIGS. 10 and 11;

FIG. 13 gives a schematic view of a multiplexing circuit; and

FIG. 14 shows the structure of a cell of an output stack of a memory.

DETAILED DESCRIPTION

FIG. 1 shows a memory 1 which could for example be an EEPROM made according to a known semiconductor technology.

It will be assumed that this memory 1 is organized in matrix form in L rows of M words each formed by B elementary cells. In a standard way, L, M and B are integers equal to powers of 2. For example L=128, M=64 and B=8. This represents a memory with a capacity of 8 kilowords of 8 bits, giving 64 kilobits.

With each word there is associated an address ADR= ADRk-1 ADRk-2 . . . ADR1 ADR0 encoded on K bits such that typically there will be $2^K$=L * M. In the description, it will be assumed that K=13, the seven most significant bits (ADR12 . . . ADR7) of the address determining the row in question, and the six least significant bits (ADR6 . . . ADR0) of the address determining the word that is to be read in the row considered.

The memory 1 may be read in groups of P words simultaneously, from an initial address received from the exterior. P is an integer, preferably a power of 2. To do this, the memory array is divided into P sub-arrays, each of the P words read simultaneously coming from one of the sub-arrays. Let P=$2^N$, with N<K. As will be seen, the reading in groups of P words is implemented by the modification of the addressing of the decoders of the memories with regard to N given address bits.

These N bits may be bits with contiguous positions so that the words read simultaneously are at contiguous addresses.

Indeed, although the memories are generally designed so as to enable random and asynchronous exchanges: The words contained in a memory are often not read (and written) one by one in a totally random manner but rather in groups of adjacent words corresponding to consecutive addresses. Moreover, often the memories are used synchronously, since the addresses are given by a microcontroller or a microprocessor and are therefore delivered synchronously with the clock signal of this microcontroller or microprocessor during the reading of a set of words.

In practice, the words read simultaneously in a group and the groups of words read successively will be located, in the example, at consecutive addresses. This facilitates the use several embodiments of the invention and makes it possible to limit the power consumption of the memory. The use is facilitated inasmuch as there is correspondence between reading and writing, the words written during a write cycle being generally written as consecutive addresses. The limiting of power consumption may be achieved because the modifications of selection in the decoders of the memory are limited when groups of words are read successively, since the addresses of a group of words being close to the addresses of the group of words read previously.

As shall be seen, the memory 1 can also be read in a standard sequential way, namely word by word. The reading of a given word then conventionally entails the assumption of the prior supply, from the exterior of the memory, of its address. It is possible, as the case may be, to implement a memory according to the invention that permits only reading by groups of words. However, a memory comprising both read modes generally will have wider application. Furthermore, if it is desired to make a programmable memory, it is often easier in terms of complexity and therefore power consumption to manage a word-by-word writing operation. This implies a capacity to successively supply the addresses of the words to be written in the memory from the exterior.

In the example shown, P=2, namely N=1. Reading in groups of two words is implemented by the modification of the addressing of the decoders of the memory as far as a given address bit is concerned. It is assumed that this bit is the least significant bit ADR0. For K particular address bits ADR12 . . . ADR1 ADR0, if ADR0=0 (even-parity address) the words located at the addresses ADR12 . . . ADR1 0 and ADR12 . . . ADR1 1 are read. If ADR0=1 (odd-parity address) the words located at the addresses ADR12 . . . ADR1 1 and (ADR12 . . . ADR1 0)+2 are read.

The embodiment of memory 1 depicted in FIG. 1 is formed by two half-arrays ME and MO, each half-array being formed by 128 rows of 32 words, the half-array ME corresponding to the addresses whose least significant bit is equal to 0 (even-parity half-array) and the half-array MO corresponding to the addresses whose least significant bit is equal to 1 (odd-parity half-array).

The memory 1 comprises:

an address input parallel port 2 for the parallel reception of the addresses ADR of the words to be read, a data output parallel port 3 for the parallel supply to the exterior of the binary information elements referenced DATA7 . . . DATA0, corresponding to the addresses received, a counter COUNT enabling the production of the addresses ABUF from an initial address received by the memory, a demultiplexer circuit DEMUX receiving the addresses from the counter and giving the half-arrays the addresses ADRE and ADRO of the words to be read in these half-arrays, two row decoding circuits DECRE and DECRO respectively associated with the half-array ME and the half-array MO and enabling the selection of one row among the L rows of each of the half-arrays, two column decoders DECCE and DECCO respectively associated with the half-array ME and the half-array MO and enabling the selection of one among the M/P columns of each of the half-arrays, two read circuits SAE and SAO respectively associated with the half-array ME and the halfarray MO, enabling the extraction respectively, by means of a given address, of a binary information DE from the half-array ME and a binary information element DO from the half-array MO, an output multiplexer MUXS with P parallel type inputs and P parallel type outputs enabling the supply of two binary information elements Di and Di+1 in such a way that Di=DE and Di+1=DO or Di=DO and Di+1=D3, an output stack BUFS receiving Di and Di+1 in parallel and giving Di and Di+1 in series at the port 3, and a control circuit CDB giving control signals to the different circuits of the memory in order to provide for appropriate synchronization in the working of the memory 1, on the basis of a clock signal CKOEPAD with the frequency Fread and a read mode control signal MODE.

The logic structure of the decoding and read circuits shall not be described in exhaustive detail as the making of these circuits entails no special problems for those skilled in the art.

Furthermore, the memory may have other circuits such as output buffers enabling the selective use of the port 3 at input or at output, supply circuits providing voltages adapted to the read, write, erasure and other operations.

The memory may be made physically in the form of an individualized integrated circuit comprising only this memory or else in the form of a part of an integrated circuit comprising other elements. Here below, it shall be assumed that the memory is individualized, the ports and the outputs being then connected to pins.

A description shall now be given of the working of the memory 1 and of elements of this memory functionally related to the selection of the addresses of the words to be read and to the extraction of the corresponding information elements. For a given logic signal X, the reference /X shall be given to the inverse signal.

In the memory 1, the word lines associated with each half-array are physically dissociated from the corresponding rows of the other half-array. Indeed, in the mode of reading by groups of words, if the least significant address of one of the words to be read is on the last position of a row, then the other word that has to be read simultaneously is on the next row. It is therefore desirable to be able to read two words that are located on two distinct rows.

As shall be seen, when the memory is read in a standard way, namely word by word, the decoding is standard. The MODE signal is then in a given logic state. For example, there will be MODE=0 in the example described.

When the memory is to be read in groups, MODE=1. The signal MODE can then for example be given to the memory by means of a dedicated input pin of the circuit. Alternately, to avoid having to add an additional pin, it is possible to use a particular configuration of standard pins. This type of method is a standard one for the configuration of an EEPROM in a particular mode of use. For example, this type of method is conventionally used in a data protection mode known as "Data Software Protection." In this mode of protection, the memory is provided with a given series of addresses, the read and/or write control signals being placed in particular states, with the memory recognizing the configuration.

With respect to the clock signal CKOEPAD, it may also be given to the memory by means of a dedicated pin. It is also possible to use a pin which is conventionally located in the memories, this pin being used to receive the signal CKOEPAD in group reading mode. Thus, the example illustrated uses an output enable pin 4 receiving a signal referenced /OE (output enable signal which conventionally indicates the direction of transfer of the data elements between the memory and the exterior, the memory being a master if /OE=0 and a memory if /OE=1). In other words, the port 3 of the memory is an input port if /OE=1 and an output port if /OE=0. In memory read mode, naturally it is the master mode that is set. In the memory 1, when the group read mode is initialized, the last address present at the port 2 is memorized. This address will constitute the initial address, namely the address of the first word of the first group of words to be read. The information elements extracted are stored in the output stack before being given to the exterior of the circuit.

The initial address may be used to initialize the counter COUNT whose output controls the decoding. This counter is incremented by +P at each cycle of the signal CKOEPAD, for example on the trailing edges of the signal. This clock signal may also be used to control the output of the P information elements extracted in parallel. For P=2, the output is synchronized on the leading edges and trailing edges of the signal CKOEPAD. If P is greater than 2, an internal synchronization signal will be created for example on the basis of a frequency multiplier circuit receiving the signal CKOEPAD, the edges of this internal signal being used to control the output of the information elements.

Let Tacc be the maximum access time in read mode of the memory 1. The maximum value that can be chosen for the frequency Fread is equal to 1/Tacc.

The group reading method takes place as follows:

1—Input in read mode by groups of words.

2—The storage of the initial address (ADR(0)) and parallel reading of the first two words (Di(0) and Di+1(0)) read at the addresses ADR(0) and ADR(0)+1, and loading of the corresponding information elements in the output stack.

3—The supplying to the memory of the clock signal CKOEPAD, at the frequency F, with F smaller than or equal to Fread.

3a—The incrementation of the counter which gives ADR (1)=ADR(0)+2/output of Di(0)/beginning of reading of Di(1) and Di(1) and Di+1(1) at the addresses ADR(l) and ADR(l)+1.

3b—The shifting of the output stack/output of Di+1(0).

3c—The end of the reading of Di(1) and Di+1(1)/ incrementation of the counter which gives ADR(2)= ADR(1)+2/output of Di(1)/beginning of the reading of the data elements Di(2) and Di+1(2).

3d—The shifting of the output stack/output of Di+1(1). Etc.

It can be seen that from the step 3a onwards, the output frequency of the information elements is P * F, namely 2 * F. In other words, if we assume that F=Fread, the access time to the information elements seen from the exterior is Tacc/P, namely Tacc/2.

A detailed description shall now be given of a preferred exemplary embodiment of the memory 1 enabling the implementation of the above method.

A description shall be given first of all of circuits enabling the production of the control signals of the memory before a description is given of the circuits processing the addresses and the information elements extracted. FIG. 2 illustrates a circuit 10 enabling the production of non-overlapping signals in the high state from a clock signal. A circuit of this kind will be used in the control circuit CDB of the memory 1, as shall be seen here below.

The embodiment shown in FIG. 2 comprises an input 11 to receive a clock signal CLK (illustrated in FIG. 3a) and two outputs 12 and 13 to produce output signals CKOUT1 and CKOUT2 (illustrated respectively in FIGS. 3c and 3b). A two-input NOR type logic gate 14 receives the complementary signal of the signal CKL (produced by an inverter 16) at one input and the signal CKOUT1 at its other input. A two-input NOR type logic gate 15 receives the signal CLK at one input and the signal CKOUT2 at its other input.

The signal CKOUT2 is produced by means of two inverters 17 and 18 that are series-connected at output of the logic gate 14. The signal CKOUT1 is produced by means of two inverters 19 and 20 series-connected at output of the logic gate 15.

The logic gates 14, 15 and 16 enable the production of output signals that are not simultaneously in the high state. The inverters 17, 18, 19 and 20 are used to ensure that there is no overlapping by introducing a time lag between the passage to the low state of one of the output signals and the rising to the high state of the other signal.

Let S1 and S2 be the signals produced by the gates 14 and 15. Let it be assumed that CLK is in the low state. S1 is in the low state, therefore CKOUT2 is in the low state. Hence S2 is in the high state and CKOUT1 is also in the high state. When a leading edge appears on the signal CLK, the signal S2 goes to a low state. Then the signal CKOUT1 too goes to the low state. This leads to the rise of S1 to the high state and then the rise of the signal CKOUT2. If the signal CKL subsequently goes back to the low state, the signal S1 too will go to the low state. After a period of time, induced by the inverters 17 and 18, the signal CKOUT2 goes back to the low state. This leads to the rise of S2 and consequently the rise of CKOUT1. This operation is shown in the timing diagram of FIG. 3.

FIG. 4 illustrates a circuit 30 enabling the production of a signal LOAD to control the loading of the counter COUNT. A circuit of this kind will be used in the control circuit CDB of the memory 1, as shall be seen here below.

It has two inputs 31 and 32 to respectively receive control signals LATCH and MODE and two outputs 33 and 34 to respectively give the signals LOAD and /LOAD. The signals LATCH and MODE are given, after inversion of the signal MODE in an inverter 36, to a NAND type two-input logic gate 35. The output 34 is connected to the output of the gate 35 and the output 33 is connected to the output of the gate 35 by means of an inverter 37.

When MODE=0 and LATCH=1, LOAD=1. When MODE=1, LOAD=0. As seen here above, the signal MODE represents the reading mode chosen. FIG. 5 illustrates an exemplary embodiment of a circuit implemented in the control circuit CDB.

This circuit 40 produces control signals SET and CMD at outputs 43 and 44 (these control signals are illustrated in FIGS. 6e and 6f) from signals CKOEPAD and MODE (illustrated in FIGS. 6a and 6b) received at inputs 42 and 41 of this circuit 40.

An embodiment of the circuit 40 comprises:

a two-input NOR type logic gate 45 receiving the signals MODE and CKOEPAD, the signal produced at output of this port being inverted in an inverter 46 which produces a signal IOE (illustrated in FIG. 6c), a two-input NAND type logic gate 47 receiving the signals MODE and CKOEPAD at input, a two-input XOR type logic gate 48 having its inputs connected to the output of the logic gate 47, one directly and the other by means of a delay circuit 49 consisting, for example, of two inverters and one capacitor, a three-input NAND type logic gate 50 having a first input receiving the signal IOE, a second input connected to the output of the gate 47 and a third input connected to the output of the gate 48 by means of an inverter 51. This gate produces a signal CKIN=/SET, the signal SET being produced by an inverter 52 from the signal /SET. The signal CKIN is illustrated in FIG. 6d, a NOR type RS flip-flop circuit 53 receiving the signal SET at its setting input and receiving the complementary signal of the signal MODE (produced by an inverter 54) at its resetting input, a three-input NAND type logic gate 55 having a first input connected to the output of the gate 48 by means of the inverter 51, a second input receiving the signal IOE and a third input connected to the inverter output of the flip-flop circuit 53 by means of an inverter 56. This gate 55 produces the signal CMD by means of an inverter 57. The operation is as follows.

Let it be assumed that MODE=0. The gate 45 produces the signal /CKOEPAD and IOE =CKOPEAD. The signal IOE is herein an internal output enabling signal. It will be used to configure the port 3 as an input port (IOE=0) or as an output port (IOE=1). In group reading mode, the signal IOE is maintained in the high state by dictating MODE=1. The port 3 is therefore used solely as an output port. This production of IOE is related to the fact that a pin conventionally dedicated to a function other than that of the reception of a clock signal is used. If a specific pin is dedicated to the reception of the clock signal CKOEPAD, the circuit described will be adapted in an evident manner.

If it is assumed that CKOEPAD=1, then IOE=1. The gate 47 produces a high logic signal that is given to the second and third inputs of the gate 50. We therefore have CKIN=1 and SET=0.

Since MODE=SET=0, the gate 55 receives a low signal at its third input. Consequently, CMD=0.

To go into group reading mode, MODE=1 is dictated. The signal IOE is therefore maintained in the high logic state.

When a trailing edge appears in the signal CKOEPAD, the gate 47 produces a low logic state. This state gets propagated up to the third input of the gate 50 by means of the first input of the gate 48. Consequently, the signal CKIN goes to the low state and the signal SET goes to the high state. The gate 55 then receives a high logic signal at its third input but since the signal received at its first input has gone to the low state, the signal CMD remains at 0.

When the high logic signal produced by the gate 47 is propagated up to the second input of the gate 48, this gate 47 produces a signal at the low logic state. Consequently, the signal SET goes back to the low state. The duration of the positive pulse of the signal SET is sized by the circuit 49.

When a leading edge appears in the signal CKOEPAD, the signal produced by the gate 47 goes to the low state. The output of the gate 48 then goes to the high state, and does so long as the low state has not been propagated through the circuit 49. Consequently, the signal CMD goes to the high state. When the output of the gate 48 goes to the low state, the signal CMD also returns to this state. This operation is shown in FIG. 6.

FIG. 7 illustrates an embodiment of a cell 60 of the counter COUNT.

An elementary counting cell 60 has an input AI to receive an address bit ADRi, and input CI to receive a signal CARRYIN, an output AO to give an address bit ABUFi, an output CO to give a signal CARRYOUT, and a control parallel input CLOCK to receive clock signals CK1, /CK1, CK2 and /CK2 and the signals LOAD and /LOAD. Signals CK1 and CK2 that are not overlapping in the high state will be produced by using the circuit 10 in such a way that CKL=CKIN, CKOUT1=CK1 and CKOUT2=CK2.

FIG. 8 illustrates the structure of an embodiment of the cell 60.

The input AI is connected to an inverter 61 by means of a CMOS switch 62 controlled by the signals LOAD and /LOAD in such a way that the switch is closed (namely on) if LOAD=1 and open if LOAD=0.

The output of the inverter 61 is connected by means of a CMOS switch 63, controlled by the signals CK2 and /CK2, to the input of a storage cell formed by two inverters 64 and 65 mounted back to back. The switch 63 is closed if CK2=1. If not, it is open.

The output AO is connected to the output of the storage cell by means of two seriesconnected inverters 66 and 67. The output of the storage cell is furthermore connected to an input of an two-input XOR type logic gate 68 and to an input of a two-input NAND type logic gate 69. The second inputs of the gates 68 and 69 are connected to the input CI.

The output of the gate 68 is connected to the input of the inverter 61 by means of a CMOS switch 70 controlled by the signals CK1 and /CK1. The switch 70 is closed if CK1=1. If not, it is open. Finally the output CO is connected to the output of the gate 69 by means of an inverter 71.

There are two modes of operation of the cell 60, depending on whether the operation is in standard reading mode (word-by word-reading) or in group reading mode.

In standard reading mode, the switches 63 and 70 are closed. Consequently, ABUFi=ADRi. Thus, the cell is transparent in this mode In group reading mode, two stages can be distinguished.

In the group reading mode, the switches 62 and 63 are closed in order to store the initial reading address referenced ADRi. Then these switches are opened, and thereafter the switch 70 is closed. An operation of addition with carry is then performed by means of the gates 68 and 69. These gates produce respectively 0 and 0 if ADRi=CARRYIN=0, respectively 1 and 0 if ADRi=1 and CARRYIN=0 or if ADRi=0 and CARRYIN=1 and respectively 0 and 1 if ADRi=CARRYIN=1. The result is stored in the storage cell by closing the switch 63 after closing the switch 70 to avoid any looping.

FIG. 9 illustrates a counter structure COUNT enabling the implementation of several embodiments of the invention.

The counter COUNT in FIG. 9, has a number of cells identical to the number of address bits used to access the words stored in the memory, namely thirteen in the example shown.

The thirteen cells 600 to 612 are parallel-connected, each of the cells (600+I) receiving the $i^{th}$ address bit ADRi and giving a data element ABUFi.

The inputs CI of the cells 602 to 612 are connected to the outputs CO of the cells 601 to 611. The output CO of the cell 612 is connected to nothing. The input CI of the first cell 600 receives a logic 0. The input CI of the cell 601 receives a signal COUNTUP.

When the system is in word-by-word reading mode, COUNTUP=0. Consequently, the signals CARRYIN received by the cells and the signals CARRYOUT given by the cells are all in the logic state 0. Consequently, for each cell, ABUFi=ADRi. In other words, the counter is equivalent to a storage flip-flop circuit whose loading is controlled by the signal LOAD.

When the system is in the mode of reading by groups of words, MODE=1. The signal COUNTUP has transitions at the frequency F. Consequently, at each leading edge of COUNTUP, the cell 601 will modify its contents by adding 1 to its current contents, which amounts to adding 2 to the previously memorized address if all the cells are considered. If this addition takes the form of the presence of a carry value equal to 1, then this carry value is propagated towards the next cell 602 and so on and so forth.

The demultiplexing circuit DEMUX gives the addresses (ADRO12 ... ADRO0, ADRE12 ... ADRE0) of the words to be read to the decoding circuits associated with the half-arrays.

The circuit DEMUR adapts the addresses given to the decoders to the even-parity or odd-parity character of the initial reading address, when the memory is in group reading mode.

If this initial address is an even-parity address, the subsets formed by the bits ABUF1 to ABUF12 given by the counter COUNT correspond to the effective addresses of the words to be read for the two half-arrays.

If this initial address is an odd-parity address, the subsets formed by the bits ABUF1 to ABUF12 are valid only for the addresses of the words to be read in the odd-parity half-array. The words to be read in the even-parity half-array are located at the addresses ADRE12 ... ADR1=ABUF12 ... ABUF1+1 (or else again at the addresses ABUF12 ... ABUF0+2). In other words, for a simultaneous reading of two words, each located in one of the half-arrays, the bits ADRE12 ... ADRE1 and ADRO12 ... ADRO1 to be given to the decoders are then different. With regard to ADREO0 and ADRO0, it is not strictly necessary to give them to the decoders as each of the half-arrays corresponds to a single given value of a least significant address bit. It is possible on the contrary to take account of the value of this address bit during a standard reading operation to inhibit the reading of the half-arrays that are not involved so as to reduce the consumption of the circuit.

The circuit DEMUR is for example formed by cells such as the cell 80 of FIG. 10. The basic cell 80 illustrated in FIG. 10 comprises an input IN to receive a signal ABUFi, an input CDE to receive the signal MODE, outputs ADE and ADO to give signals ADREi and ADROi, inputs C1 and C2 to receive two signals CARRY1 and CARRY2 and an output C3 to give a signal CARRY3.

The internal structure of the cell 80 is illustrated in FIG. 11. It has a two-input NOR type logic gate 81 receiving the signal ABUFi at one input and the signal CARRY1 at the other input. An inverter 82, whose input is connected to the output of the gate 81, produces the signal ADREi.

A three-input NAND type logic gate 83 receives the signal ADREi at one input. Another input receives the signal MODE. The last input receives the signal CARRY2. This gate 83 produces the signal CARRY3 by means of an inverter 84. Finally, the output ADO is connected to the input IN. We therefore have ADOi=ABUFi. FIG. 12 shows the circuit DEMUR. It has a set of parallel-connected cells 800 to 812. The number of cells is identical to the number of bits used to address the words of the memory, namely thirteen in the example shown.

The cells 800 to 812 receive the signals ABUF0 to ABUF12 at their inputs IN and the signal MODE at their inputs CDE.

The cells 801 to 812 have their inputs C1 and C2 connected to the outputs C3 of the cells 800 to 811. The cell 800 receives a logic 0 at its input C1 and the signal ABUF0 at its input C2. In word-by-word read mode, the signals CARRY3 produced by the cells are all in the logic state 0, the signal MODE being itself in the logic state 0. The addresses given to the decoders by the circuit DEMUR are therefore identical to those that they receive. The circuit DEMUR is then transparent, except that it induces a slight delay due to the time taken to cross the logic gates that constitute it.

In group reading mode, a distinction may be made according to whether the initial address is an even-parity address or an odd-parity address.

If the initial address is an even-parity address, ABUF0=0. Consequently, the signals CARRY3 produced by the cells will all be in the logic 0 state. Similar to the word-by-word reading mode, the circuit DEMUR is transparent.

If the initial address is an odd-parity address, ABUF0=1. The cell 800 will therefore produce a signal CARRY3=1 that is given to the cell 801, the signal ADRE0 being then at 1.

This cell 801 will produce CARRY3=1 and ADRE1=1 if ABUF1=1, and CARRY3=0 and ADRE1=1 if ABUF1=0. Similar to the case of the counter, the carry value is propagated in the cells so long as the signals ABUFi received are in the high logic state.

The association of the counter COUNT and of the circuit DEMUR enables the successive reading of the groups of words, the words of a group being for their part read simultaneously. This configuration is valuable if the number of words for a group is small. If the number of sub-arrays is great, it is possible as the case may be to use only the circuit DEMUR and make only a group-by-group reading (as a word-by-word reading is done in a conventional way). This possibility on the contrary will result in substantial space requirements and consumption.

FIG. 13 gives a schematic illustration of the composition of an embodiment of the output multiplexing block. This block has two multiplexers MUXSE and MUXSO with parallel inputs and outputs each receiving information elements DE and DO and giving data elements Di and Di+1 respectively at output. These multiplexers are controlled by the signal ABUF0 in such a way that if ABUF0=0 then Di=DE and Di+1=DO and such that if ABUF0=1 then Di=DO and Di+1 =DE.

The data elements Di and Di+1 are received by the output stack. If the initial reading address in group reading mode is in the even-parity half-array then, for each word reading, Di comes from the even-parity half-array and Di+1 comes from the odd-parity half-array. If this initial address is in the odd-parity half-array then, for each word reading, Di comes from the odd-parity half-array and Di+1 comes from the even-parity half-array.

The output stack is a static stack that makes it possible, on the basis of the simultaneous reception of the data elements Di and Di+1 at a frequency F, to serially provide the data elements Di and Di+1 successively at a frequency **2 * F**.

The output circuit is formed by basic cells such as the one illustrated in FIG. 14 which enables the processing of two bits (one per data element to be put out).

The cell 90 may comprise two series-connected half-cells 90*a* and 90*b*. The half-cell 90*a* has a two-input NOR type logic gate 91 receiving the signals Di and /SET at its inputs. A two-input NOR type logic gate 92 receives the signals /Di and /SET at its inputs. A two-input NAND type logic gate 93 has one of its inputs connected to the output of the gate 91 by means of an inverter 94. A two-input NAND type logic gate 95 has one of its input connected to the output of the gate 92 by means of an inverter 96. The second input of the gate 93 (and respectively the gate 95) is connected to the output of the gate 95 (and respectively the gate 93). The output of the gate 95 corresponds to the output of the half-cell 90*a*. This output gives a signal Douti.

The half-cell 90*b* has a two-input NOR type logic gate 101 receiving the signals Di+1 and /SET at its inputs. A two-input NOR type logic gate 102 receives the signals /Di+1 and /SET at its inputs. A two-input NAND type logic gate 103 has one of its inputs connected to the output of the gate 101 by means of an inverter 104. A two-input NAND type logic gate 105 has one of its inputs connected to the output of the gate 102 by means of an inverter 106. The second input of the gate 103 (and of the gate 105 respectively) is connected to the output of the gate 105 (and of the gate 103 respectively). The output of the gate 103 corresponds to the output of the half-cell 90*b*.

The output of the half-cell 90*b* is connected by means of a MOS switch 98 to the second input of the gate 95. This switch is controlled by the signals CMD and /CMD in such a way that this switch is closed (namely on) if CMD=1. If not, it is open.

In terms of operation, the cell works as described below.

The sets formed by the gates 93 and 95 and gates 103 and 105 each have the function of storing the logic states of the signals Di and Di+1 for a given read operation.

If SET=1, the gates 91 and 92 (101 and 102 respectively) give the signals /Di and Di (respectively /Di+1 and Di+1). The first inputs of the gates 93 and 95 (103 and 105 respectively) therefore receive the signals Di and /Di (Di+1 and /Di+1 respectively). The gates 93 and 95 (103 and 105 respectively) therefore give the signals /Di and Di (/Di+1 and Di+1 respectively). If SET=0, the gates 91, 92, 101 and 102 give a logic 0. The first inputs of the gates 93, 95, 103 and 105 therefore receive a logic 1. The gates 93 and 95, and 103 and 105, then give complementary signals: either 0 and 1 or 1 and 0 depending on the states of their second inputs when the signal SET goes to the low state.

When the signal SET goes to the high state, the half-cells are cut off from one another (CMD=0). The signals Di and /Di+1 are then stored in the storage cells formed for each of the half-cells of two NAND type logic gates mounted back to back.

Then the signal SET goes to the low state. The signals Di and /Di+1 are then held in the storage cells. The signal Di for its part is available at output of the memory. We have Douti=Di.

When the signal CMD goes to the high state, the data element /Di+1 is transferred from the half-cell 90*b* to the half-cell 90*a* and inverted by the gate 95. The storage cell of the half-cell 90*a* then stores the signal Di+1, this signal being available at output of the memory. We have Douti= Di+1.

Then the signal CMD goes to the low state, thus cutting off the half-cells 90*a* and 90*b* from one another. It is then possible to memorize the data elements read at the next reading cycle in these half-cells.

The output stack will have as many parallel-connected cells 90 as there are bits per output data element. In the example considered, the stack will have eight cells.

Having thus described at least one illustrative embodiment of the invention, various alterations, modifications and improvements will readily occur to those skilled in the art. Such alterations, modifications and improvements are intended to be within the spirit and scope of the invention. Accordingly, the foregoing description is by way of example only and is not intended as limiting. The invention is limited only as defined in the following claims and the equivalents thereto.

What is claimed is:

1. A memory circuit comprising:

a first storage circuit having a first plurality of locations;

a second storage circuit having a second plurality of locations;

means for reading a first memory location of the first plurality of locations and a second memory location of the second plurality of locations in response to a single input address being received by the memory circuit;

means for changing a mode of the memory circuit to a single address mode; and means for reading only the first memory location in response to the single address mode and the single input address.

2. The memory circuit of claim 1, wherein:

each of the first plurality of locations includes a plurality of data storage cells; and each of the second plurality of locations includes a plurality of data storage cells.

3. The memory circuit of claim 1, wherein the means for reading includes means for providing first read data from the first memory location and second read data from the second memory location, the memory circuit further comprising means for providing the first read data and the second read data sequentially at a parallel output of the memory circuit.

4. The memory circuit of claim 1, wherein the means for reading includes means for simultaneously reading the first memory location and the second memory location.

5. The memory circuit of claim 1, further comprising means for generating an address corresponding to the first memory location and an address corresponding to the second memory location by incrementing the single input address.

6. A memory circuit comprising:

a first storage circuit having a first plurality of locations;

a second storage circuit having a second plurality of locations;

a control circuit, coupled to the first storage circuit and the second storage circuit, having an input that receives a single input address and an output that provides a first internal address to the first storage circuit and a second internal address to the second storage circuit, so that the first storage circuit provides a first stored word from at least one of the first plurality of locations and the second memory device provides a second stored word from at least one of the second plurality of locations in response to the single input address; and a parallel output circuit coupled to the first storage circuit and the second storage circuit, the parallel output circuit having a first input that receives the first stored word and a second input that receives the second stored word, the parallel output circuit further having an output that provides the first stored word and the second stored word sequentially.

7. The memory circuit of claim 6, wherein:

each of the first plurality of locations includes a plurality of data storage cells; and each of the second plurality of locations includes a plurality of data storage cells.

8. The memory circuit of claim 6, wherein the control circuit includes:

a first read circuit that provides the first internal address to the first storage circuit to read the first stored word; and a second read circuit that provides the second internal address to the second storage circuit to read the first stored word.

9. The memory circuit of claim 8, wherein the first read circuit reads the first stored word during a time in which the second read circuit reads the second stored word.

10. The memory circuit of claim 6, wherein the control circuit includes an address generator having an output that provides the first internal address and the second internal address.

11. The memory circuit of claim 10, wherein the address generator includes an incrementor that increments the single input address to yield the second internal address.

12. The memory circuit of claim 10, wherein the address generator generates the first internal address and the second internal address from an input address that was previously stored in the memory circuit.

13. The memory circuit of claim 6, further comprising a mode control circuit, having an input that receives a mode select signal and an output that controls the memory circuit to operate in a single address mode in response to the mode select signal.

14. The memory circuit of claim 13, wherein the memory circuit reads only the first memory location in response to the single address mode and the single input address when the memory circuit operates in the single address mode.

15. A method for performing a memory read operation, comprising the steps of:

receiving a single input address;

reading a plurality of memory addresses in response to the single address, to yield a plurality of multiple bit data elements; and providing the plurality of multiple bit data elements.

16. The method of claim 15, wherein:

the step of reading includes simultaneously reading a plurality of memory addresses at a first frequency; and the step of providing includes providing the plurality of multiple bit data elements at a second frequency that is an integer times greater than the first frequency.

17. The method of claim 15, wherein the step of providing includes providing the plurality of multiple bit data elements sequentially.

18. The method of claim 15, wherein the step of reading includes the steps of:

reading from a first storage circuit to yield a first one of the plurality of multiple bit data elements; and reading from a second storage circuit to yield a second one of the plurality of multiple bit data elements.

19. The method of claim 18, wherein the step of reading from a first storage circuit is performed during at least part of the step of reading from the second storage circuit.

20. The method of claim 15, wherein the step of reading includes generating a first internal address and a second internal address.

21. The method of claim 20, wherein the step of generating includes incrementing the single input address to yield the second internal address.

22. The method of claim 20, wherein the step of generating includes generating the first internal address and the second internal address from an input address that was previously stored in the memory circuit.

23. The method of claim 15, further comprising the step of receiving a mode select signal, the method further comprising a step of providing only a single multiple bit data element in response to the input address when the mode select signal is indicative of a single address mode.

24. An apparatus for performing a memory read operation, comprising:

means for receiving a single input address;

means for reading a plurality of memory addresses in response to the single address, to yield a plurality of multiple bit data elements; and means for providing the plurality of multiple bit data elements.

25. The apparatus of claim 24, wherein:

the means for reading includes means for simultaneously reading a plurality of memory addresses at a first frequency; and the means for providing includes means for providing the plurality of multiple bit data elements at a second frequency that is an integer times greater than the first frequency.

26. The apparatus of claim 24, wherein the means for providing includes means for providing the plurality of multiple bit data elements sequentially.

27. The apparatus of claim 24, wherein the means for reading includes:

means for reading from a first storage circuit to yield a first one of the plurality of multiple bit data elements; and means for reading from a second storage circuit to yield a second one of the plurality of multiple bit data elements.

28. The apparatus of claim 27, wherein the means for reading from a first storage circuit reads from the first storage circuit during at least part of a time in which the means for reading from the second storage circuit reads from the second storage circuit.

29. The apparatus of claim 24, wherein the means for reading includes means for generating a first internal address and a second internal address.

30. The apparatus of claim 29, wherein the means for generating includes means for incrementing the single input address to yield the second internal address.

31. The apparatus of claim 29, wherein the means for generating includes means for generating the first internal address and the second internal address from an input address that was previously stored in the memory circuit.

32. The apparatus of claim 24, further comprising means for receiving a mode select signal, the apparatus further comprising means for providing only a single multiple bit data element in response to the input address when the mode select signal is indicative of a single address mode.

33. A method for operating a memory, the method comprising the steps of:

receiving a mode control signal;

receiving an input address;

when the mode control signal is indicative of a multiple address mode, providing a plurality of data elements from the memory in response to the input address;

when the mode control signal is indicative of a single address mode, providing only a single data element from the memory in response to the input address;

wherein the step of providing the plurality of data elements includes one of providing the plurality of data elements sequentially, and simultaneously reading the plurality of data elements from a corresponding plurality of independent memory circuits.

34. An apparatus for operating a memory, comprising:

means for receiving a mode control signal;

means for receiving an input address;

means, operative when the mode control signal is indicative of a multiple address mode, for providing a plurality of data elements from the memory in response to the input address;

means, operative when the mode control signal is indicative of a single address mode, for providing only a single data element from the memory in response to the input address;

wherein the means for providing the plurality of data elements includes one of a means for providing the plurality of data elements sequentially, and a means for simultaneously reading the plurality of data elements from a corresponding plurality of independent memory circuits.

35. A method for operating a memory, the method comprising the steps of:

receiving a mode control signal;

receiving an input address;

when the mode control signal is indicative of a multiple address mode, providing a plurality of data elements from the memory in response to the input address, wherein each of the plurality of data elements includes a multiple bit data element; and when the mode control signal is indicative of a single address mode, providing only a single data element from the memory in response to the input address.

36. An apparatus for operating a memory, comprising:

means for receiving a mode control signal;

means for receiving an input address;

means, operative when the mode control signal is indicative of a multiple address mode, for providing a plurality of data elements from the memory in response to the input address, wherein each of the plurality of data elements includes a multiple bit data element; and means, operative when the mode control signal is indicative of a single address mode, for providing only a single data element from the memory in response to the input address.

* * * * *